United States Patent
Park et al.

(10) Patent No.: US 6,924,880 B2
(45) Date of Patent: Aug. 2, 2005

(54) LARGE-AREA MASK AND EXPOSURE SYSTEM HAVING THE SAME

(75) Inventors: Yong-Seok Park, Seoul (KR); Han-beom Jo, Euiwang (KR)

(73) Assignee: Display Manufacturing Service Co., Ltd., Suwon (KR)

( * ) Notice: Subject to any disclaimer, the term of this patent is extended or adjusted under 35 U.S.C. 154(b) by 0 days.

(21) Appl. No.: 10/402,946

(22) Filed: Apr. 1, 2003

(65) Prior Publication Data

US 2005/0073664 A1 Apr. 7, 2005

(30) Foreign Application Priority Data

Apr. 4, 2002 (KR) .................. 10-2002-0018498

(51) Int. Cl.$^7$ .......................... G03B 27/42; G03F 9/00
(52) U.S. Cl. ........................................ 355/53; 430/5
(58) Field of Search ........................ 430/5; 355/53

(56) References Cited

U.S. PATENT DOCUMENTS

| | | | |
|---|---|---|---|
| 4,780,382 A | * 10/1988 | Stengl et al. .................. | 430/5 |
| 4,804,600 A | * 2/1989 | Kato et al. .................... | 430/5 |
| 5,260,151 A | * 11/1993 | Berger et al. ................ | 430/5 |
| 6,204,509 B1 | * 3/2001 | Yahiro et al. ............ | 250/491.1 |
| 6,403,268 B1 | * 6/2002 | Kawata ........................ | 430/5 |
| 6,428,937 B1 | * 8/2002 | Katakura ...................... | 430/5 |
| 6,534,222 B1 | * 3/2003 | Suzuki ......................... | 430/5 |
| 6,562,521 B1 | * 5/2003 | Nistler et al. ................. | 430/5 |
| 2001/0016292 A1 | * 8/2001 | Kobinata et al. ............. | 430/5 |

* cited by examiner

*Primary Examiner*—Rodney Fuller
(74) *Attorney, Agent, or Firm*—Rothwell, Figg, Ernst & Manbeck P.C.

(57) ABSTRACT

Provided are a large-area mask and an exposure system having the same. The mask includes a transparent substrate, which includes a light transmission region and a light-blocking region, and a plurality of bars, which is arranged on the substrate to support the substrate. When the large-area mask is installed on the exposure system, the bars can support the mask, thus preventing downward level shifting of the mask.

34 Claims, 8 Drawing Sheets

US 6,924,880 B2

LARGE-AREA MASK AND EXPOSURE SYSTEM HAVING THE SAME

This application claims the priority of Korean Patent Application No. 2002-18498, filed on Apr. 4, 2002, in the Korean Intellectual Property Office, the disclosure of which is incorporated herein in its entirety by reference.

BACKGROUND OF THE INVENTION

1. Field of the Invention

The present invention relates to a large-area mask and an exposure system having the same. More specifically, the present invention relates to a large-area mask, by which level shifting caused by a gravitational load can be prevented, and an exposure system having the same.

2. Description of the Related Art

In recent years, a flat panel display, such as a liquid crystal display (LCD), has been applied in various fields from PCs to televisions. As is well known, the LCD includes a thin film transistor (TFT) substrate, a color filter substrate, and a liquid crystal layer therebetween. Here, each component located on each substrate, for example, a TFT array, a pixel electrode, and a color filter, has been produced by a known photolithographic method.

Meanwhile, as the size of an LCD increases, the size of a substrate and the size of a mask for patterning each component located on the substrate are also increased. FIG. 1 is a cross-sectional view of a typical exposure system including a large-area mask. A photolithographic process for manufacturing a conventional LCD will be described hereinafter with reference to FIG. 1.

An LCD substrate 10 is located on a support 20 of the exposure system. Here, the substrate 10 may be a glass substrate, and a predetermined layer where a pattern will be formed (not shown) and a photoresist layer (or a layer to be cured by light: not shown) are formed thereon. A mask 30 is located over the substrate 10, and a light source 50 is located over the mask 30. Here, the size of photolithographic mask for TFT-LCD is already reached at the size of 1500 mm×1500 mm. Additionally, it will more increase according to the development of equipment and facilities. As illustrated in FIG. 2, such a mask 30 includes a transparent quartz substrate 32 and a light-blocking pattern 35 arranged to form a predetermined shape on one surface of the substrate 32.

When the conventional mask 30 was located over the substrate 10, because of the very large area of the mask 30, the level of a central portion was shifted by a gravitational load. Thus, a deviated distance between the mask 30 and the substrate 10 degraded the quality of exposure process.

Thus, to prevent the level shifting of the mask 30, a plurality of tensile springs 40 was installed at edges of the mask 30. The tensile spring 40 was installed between the edges of the mask and a sidewall of the exposure system to enable the mask 30 located on the substrate 10 to maintain a tense state.

However, as the tensile spring 40 itself is very expensive, installation of the plurality of tensile springs 40 between the mask and the exposure system caused the very high process cost. As a result, the unit production cost of the LCD was increased.

SUMMARY OF THE INVENTION

The present invention provides a large-area mask, by which level shifting of a central portion of the mask can be prevented.

The present invention also provides the large-area mask, which can maintain a tense state on a substrate even without installing a plurality of tensile springs at the edges thereof, and an exposure system having the same.

The present invention yet provides an exposure system having the foregoing large-area mask.

In accordance with an aspect of the present invention, there is provided a mask, comprising a transparent substrate, which includes a light transmission region and a light-blocking region, and a plurality of bars arranged on the substrate to support the substrate.

It is preferred in the present invention that the bar is formed of one of a transparent material, quartz, glass, and a material that transmits ultraviolet rays.

It is preferred in the present invention that an adhesive is intervened between the bar and the light-blocking region.

It is preferred in the present invention that the bar is formed of an opaque material, and a layer having high reflexibility covers both sidewalls thereof. Here, the bar may be formed of one of aluminum and a stainless material.

It is preferred in the present invention that when a plane of the transparent substrate is rectangular, the bars are arranged to be parallel in a direction of a major axis of the transparent substrate, are arranged to be parallel in a direction of a minor axis thereof, or are arranged to be parallel in a diagonal direction thereof.

In accordance with another aspect of the present invention, there is provided an exposure system, comprising a support for supporting a substrate that will undergo a lithographic process or a light curing process, a mask which is located over the support and includes a light blocking pattern, and a light source which is located on the mask. In the exposure system, a plurality of bars is located on the mask surface facing the substrate to support the mask.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
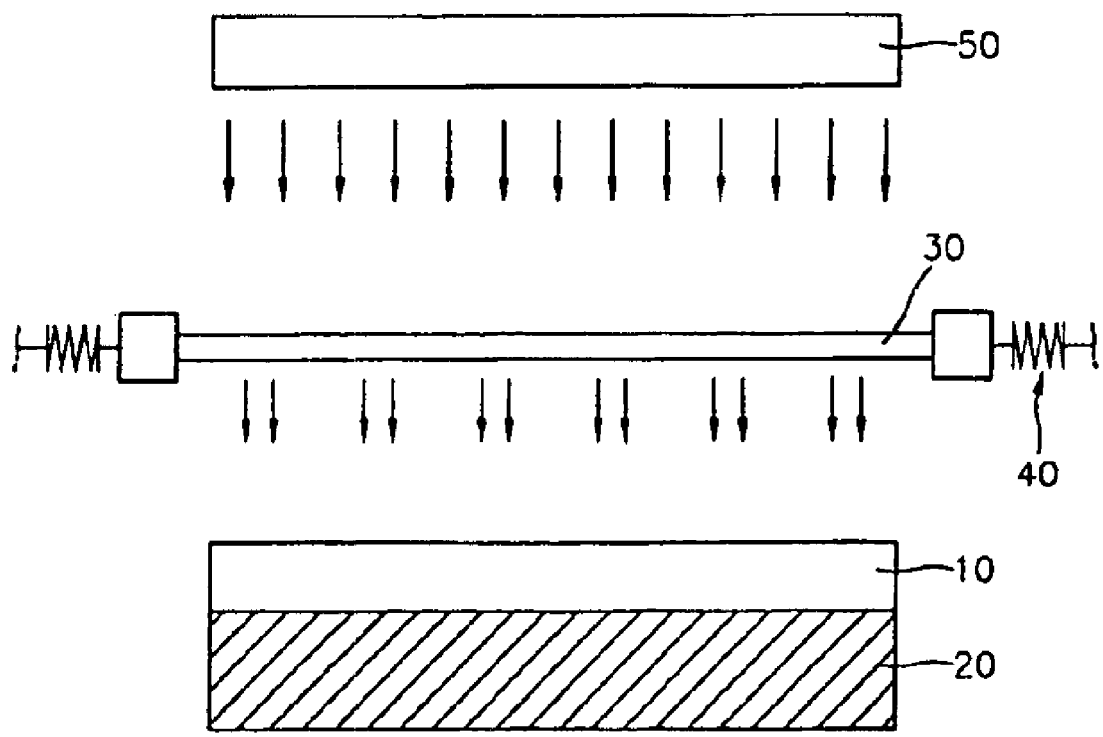
FIG. 1 is a cross-sectional view of a typical exposure system including a large-area mask.
Figure 2:
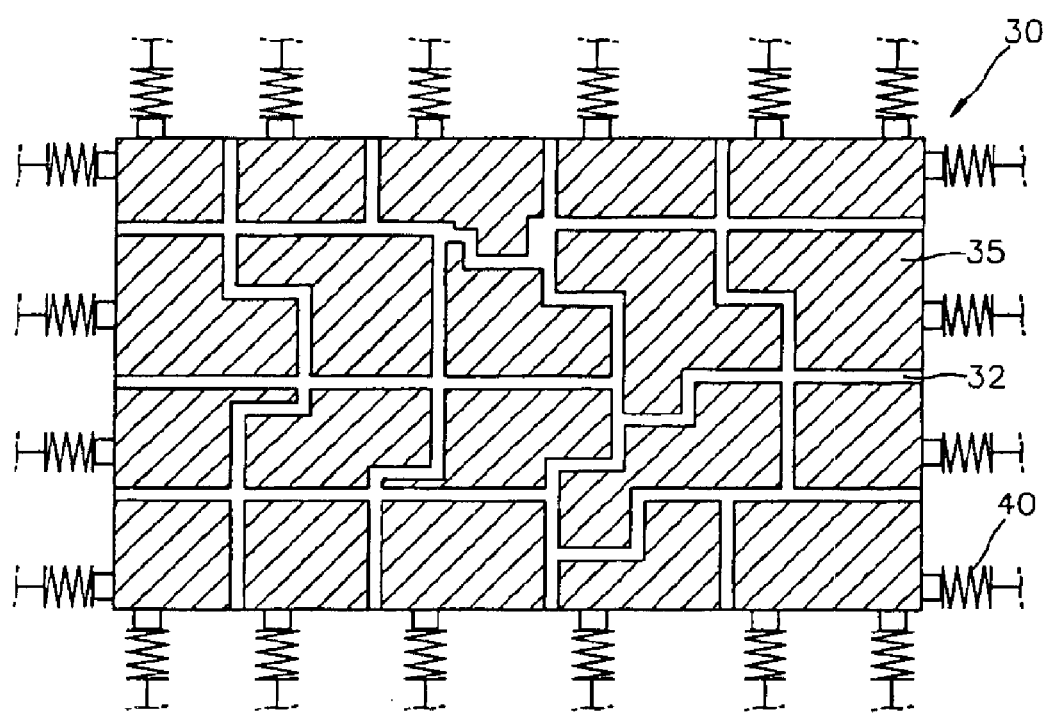
FIG. 2 is a top plan view of the conventional mask of FIG. 1.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure is thorough and complete and fully conveys the concept of the invention to those skilled in the art. In the drawings, the shape of the elements is exaggerated for clarity, and the same reference numerals in different drawings represent the same elements.

Embodiment 1

Figure 3:
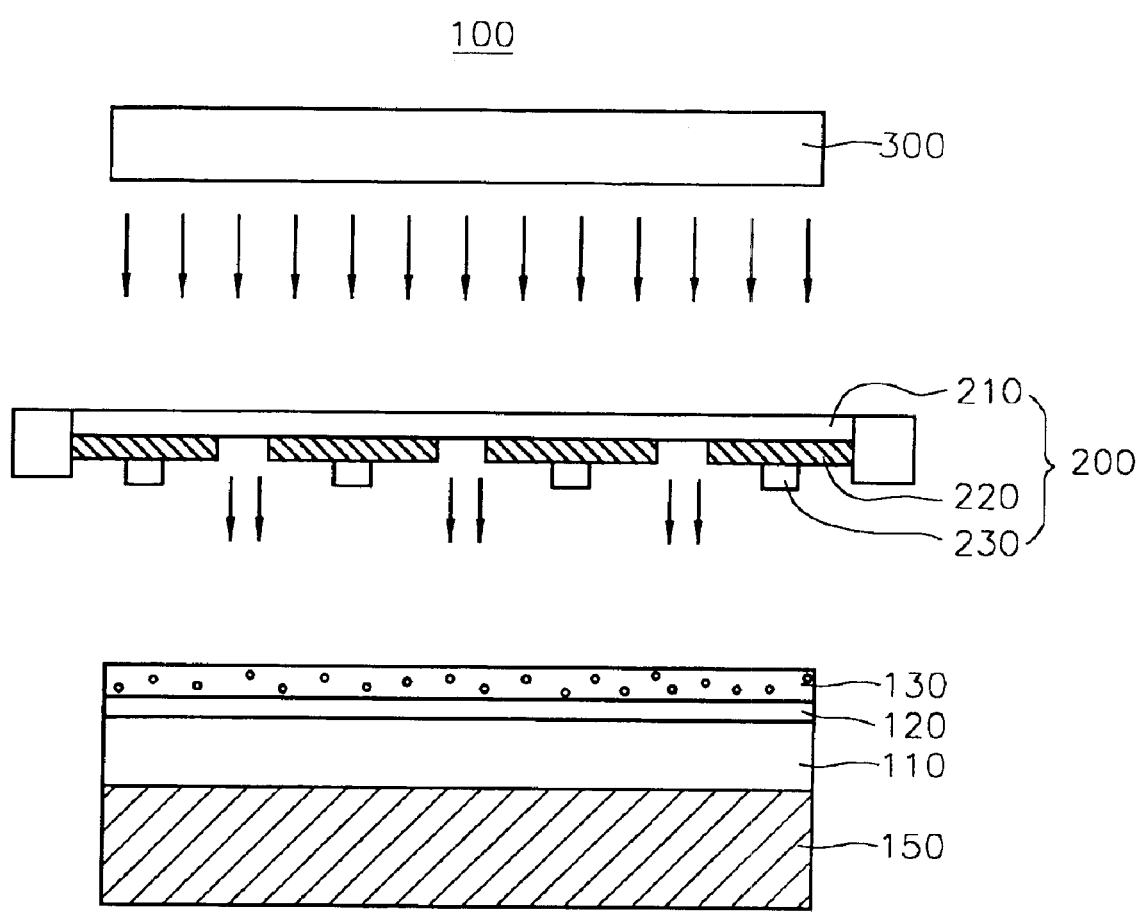
FIG. 3 is a cross-sectional view of an exposure system including a large-area mask according to a first embodiment of the present invention.

As illustrated in FIG. 3, an exposure system 100 includes a support 150 for supporting a display substrate 110, under which a predetermined pattern will be formed. Here, the display substrate 110 may be a transparent glass substrate, on which a layer where a pattern will be formed 120 and a photoresist layer 130 are sequentially formed. Also, the display substrate 110 may be one of a TFT substrate including a light-cured layer as a seals, a color filter substrate and a display panel including the TFT substrate and the color filter substrate.

A mask 200 of the present invention is located over and spaced apart from the display substrate 110 by a predetermined distance, and a light source 300 is located over and spaced apart from the mask 200.

Figure 4:
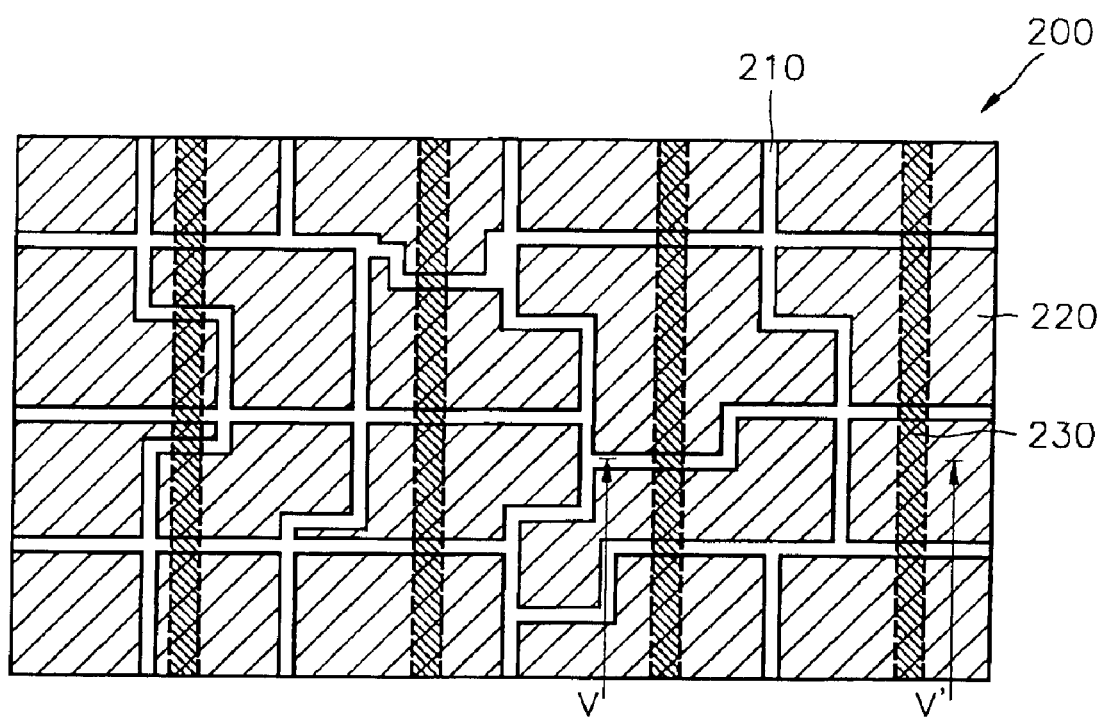
FIG. 4 is a top plan view of the mask according to the first embodiment of the present invention.
Figure 9:
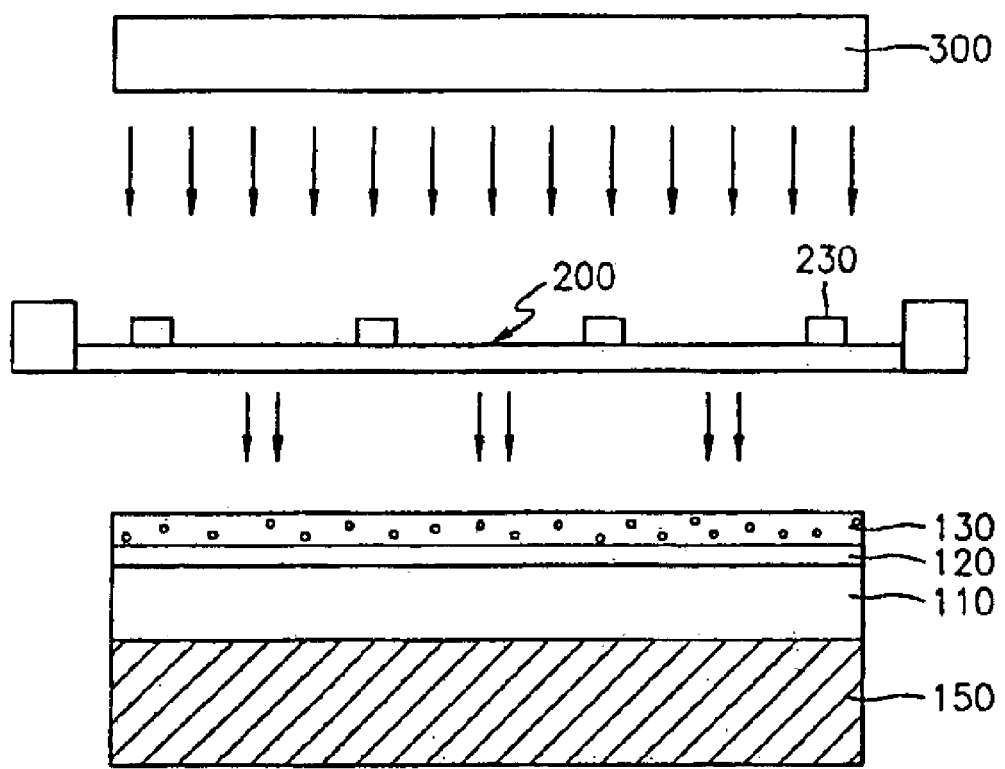
FIG. 9 is a cross-sectional view of an exposure system including the large-area mask according to another embodiment of the present invention.

As illustrated in FIGS. 3 and 4, the mask 200 includes a transparent substrate 210, such as a substrate formed of a material that can transmit ultraviolet rays or a quartz substrate, and a light-blocking pattern 220 located on the surface of the transparent substrate 210 as a predetermined shape. Here, the light-blocking pattern 220 may be formed of one of chrome (Cr) and an opaque resin. A plurality of stripe-shaped bars 230 is located on a surface of the light-blocking pattern 220 and the transparent substrate 210 in order to prevent its level of central portion from shifting due to the gravitational load. The bars 230 may be installed at the lower surface of the mask 200 as shown in FIG. 3 or the upper surface of the mask 200 as shown in FIG. 9. Here, if the transparent substrate 210 has a rectangular shape, the bars 230 may be arranged to run across the transparent substrate 210, i.e., to be parallel in a direction of a minor axis of the transparent substrate 210, and be spaced apart from each other by a predetermined interval. Here, the width of the bar 230 depends on the size of the mask 200 (or the transparent substrate). In the present embodiment, the bar 230 is formed to have a line width of 1 to 30 mm. Also, the height of the bar 230 depends on the size of the mask 200, and it is preferred in the present embodiment that the bar 230 is formed to have a height of 5 to 30 mm. The bars 230 may be formed at regular intervals. Alternatively, considering light transmissivity, the arrangement of the bars 230 may be adjusted in accordance with the arrangement of the light-blocking pattern 220. The bar 230 can be formed of one of a light transmission material and a material that can transmit ultraviolet rays, for example, quartz or glass. Accordingly, although the bars 230 are formed on the transparent substrate 210, there is no problem as an exposing error when the exposure processing is proceeded.

Figure 5:
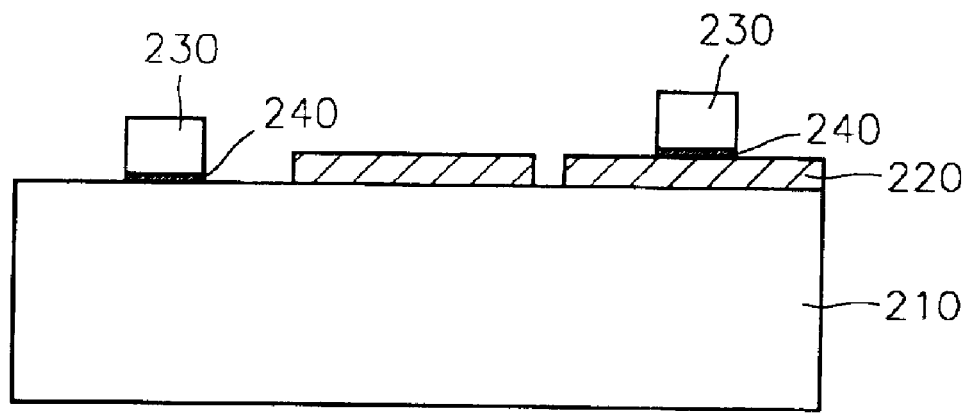
FIG. 5 is a cross-sectional view of the mask taken along the line V–V' of FIG. 4, according to the first embodiment of the present invention.

Here, as illustrated in FIG. 5, an adhesive layer 240 may be intervened between the bar 230 and the light blocking pattern 220.

As mentioned above, the plurality of bars 230 is installed to run across the mask 200, thereby supporting the mask 200. This can prevent level shifting of the mask 200. Further, because only a small number of bars 230 shows results, to install the bars on a transparent substrate is more advantageous than tensile springs in aspect of costs.

A lithographic process (or a light curing process) using the exposure system according to the foregoing embodiment will be described now.

When the light source 300 irradiates light, the light is partially absorbed in the mask 200 and partially penetrates through the mask 200. That is, the light is blocked at a portion where the light-blocking pattern 220 is located and penetrates through a portion where only the transparent substrate 210 is located. After penetrating through the mask 200, the light reaches the photoresist layer 130 (or the light-cured layer) formed on the substrate 110. Thus, the photoresist layer 130 (or the light-cured layer) is exposed to light. Next, the exposed photoresist layer 130 (or the light-cured layer) is developed to form a photoresist pattern (or a light-cured pattern, not shown). Thereafter, the layer where a pattern will be formed 120 is etched away as a shape of the photoresist pattern (or when the light-cured layer is used, a light curing process is performed) to complete a predetermined pattern. Here, as the plurality of bars 230 is extended on the surface of the large-area mask 200 which faces the display substrate 110, level shifting of a portion of the mask 200 is prevented.

Embodiment 2

The same reference numerals in the first embodiment and the present embodiment represent the same elements. Also, the same description in the first and second embodiments will be omitted here.

Figure 6:
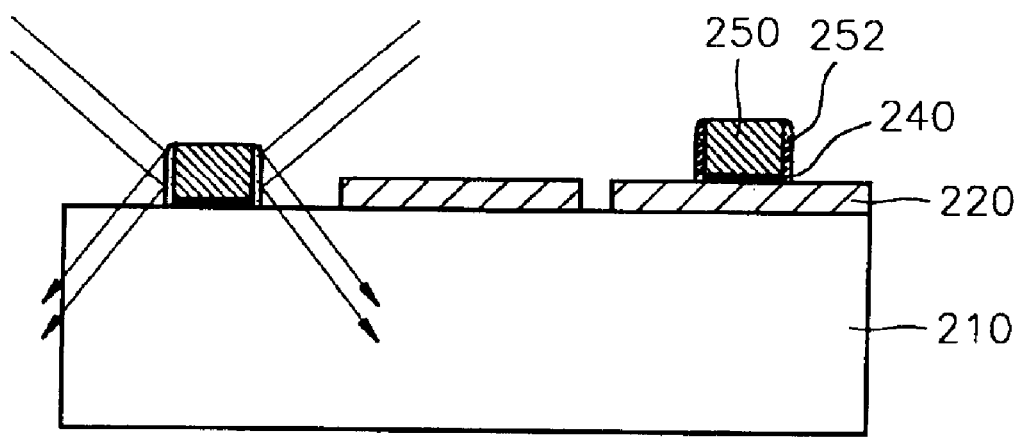
FIG. 6 is a cross-sectional view of a mask taken along the line V–V' of FIG. 4, according to a second embodiment of the present invention.

Referring to FIG. 6, a bar 250 of the present embodiment is formed of an opaque material such as aluminum and a stainless material. A high reflectivity layer 252 covers the sides of the bar 250 to reflect incident light toward the quartz substrate 210. Here, an adhesive layer 240 is located at the bottom of the bar 250. In the present embodiment, since the bar 250 is formed of the opaque material, the adhesive layer 240 may be formed between the bar 250 and the quartz substrate 210 or light-blocking pattern 220. The bar 250 of the present embodiment may be placed so as to form the same plane structure as in the foregoing first embodiment, and the width, the height, and the interval of the bar 250 are the same as that in the first embodiment.

Figure 10:
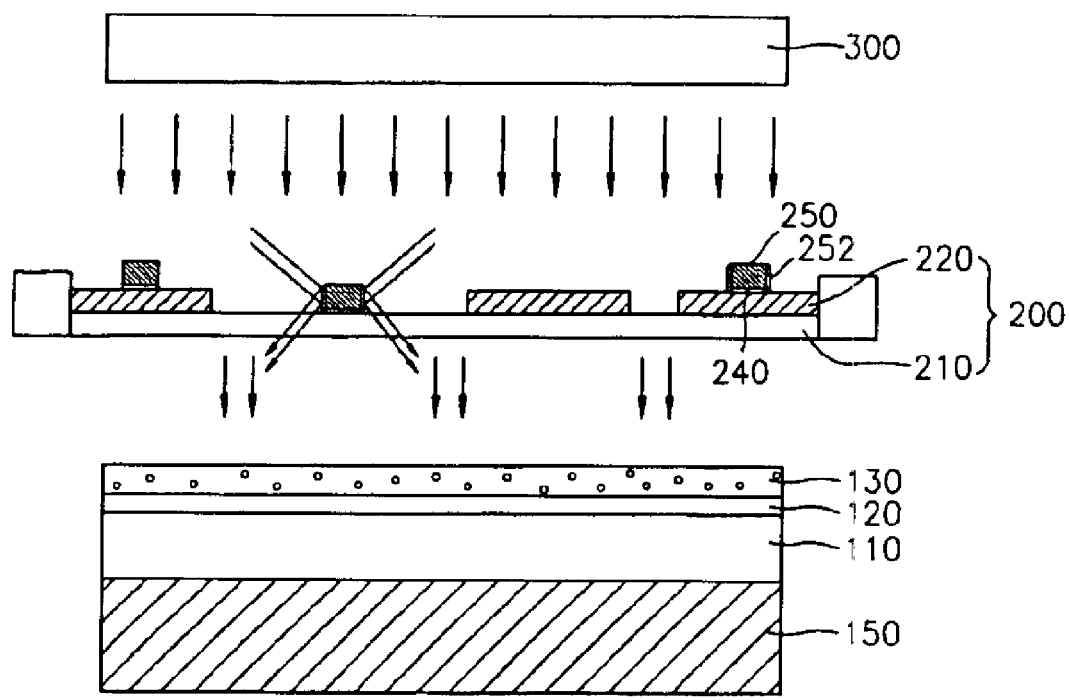
FIG. 10 is a cross-sectional view of an exposure system including the large-area mask of the FIG. 6.

According to the present embodiment, even if the bar 250 is formed of the opaque material, the bar 250 can effectively support the large-area mask 200. Also, because the highly reflected layer 252 covers the sides of the bar 250, the light damaged by the opaque bar 250 can be restored. Here, FIG. 10 is a cross-sectional view of an exposure system including the large-area mask of the FIG. 6.

Embodiment 3

Figure 7:
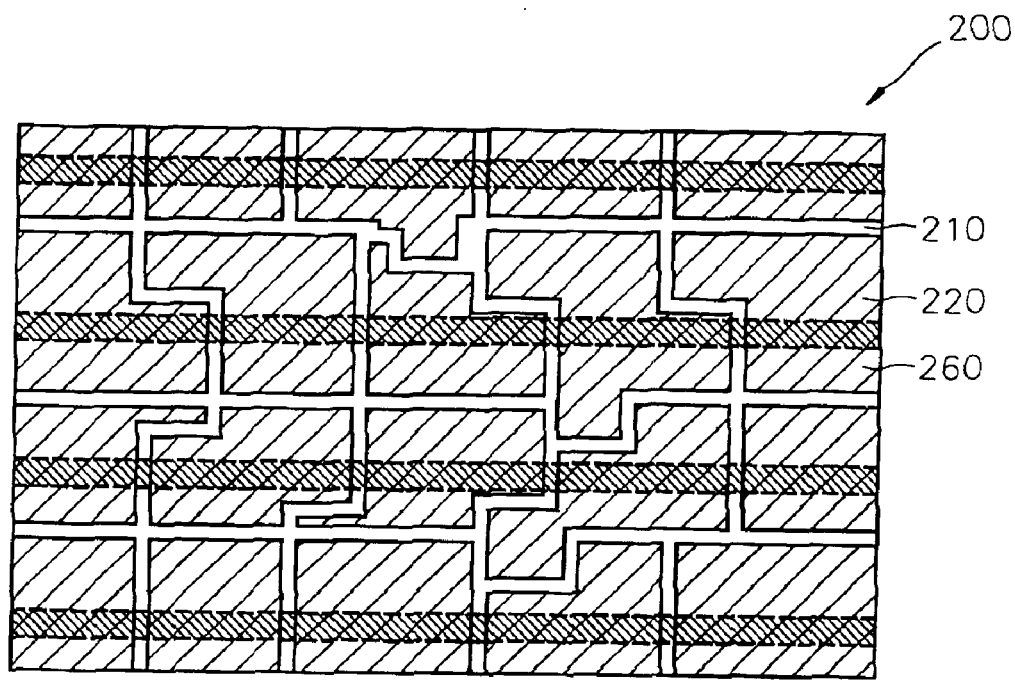
FIG. 7 is a top plan view of a mask according to the a third embodiment of the present invention.

FIG. 7 is a top plan view of a large-area mask according to a third embodiment of the present invention.

Referring to FIG. 7, when a mask 200 (a transparent substrate) has a rectangular shape, a plurality of bars 260 of the present embodiment is extended to intersect the mask 200, i.e., to be parallel in a direction of a major-axis of the mask 200. Here, the line width and the height of the bar 260 may be the same as in the first embodiment, and the bars 260 may be formed at regular intervals. Also, the bar 260 of the present embodiment may be formed of a transparent material as in the first embodiment, or formed of an opaque material with a highly reflected layer formed on the sidewalls thereof as in the second embodiment. Also, the mask 200 is the same as those in the foregoing first and second embodiments.

In the present embodiment, the plurality of bars 260 is located in the direction of the major-axis of the mask, thus obtaining the same effect as in the first and second embodiments.

Embodiment 4

Figure 8:
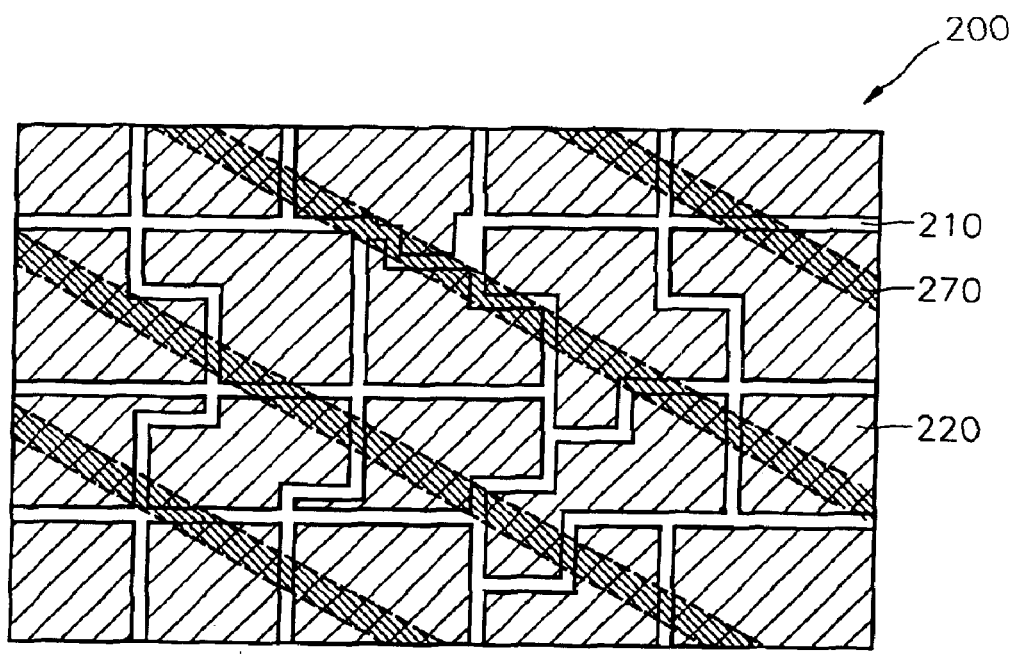
FIG. 8 is a top plan view of a mask according to a fourth embodiment of the present invention.

Referring to FIG. 8, a bar 270 of the present embodiment is extended in a diagonal direction of the mask 200. Here, a plurality of stripe-shaped bars 270 is arranged to be parallel. The line width and the height of the bar 270 may be the same as that in the first embodiment. The bars 270 may be formed at regular intervals, or the arrangement of the bars 270 may be adjusted in accordance with the arrangement of the light-blocking pattern 220. Further, the bar 270 of the present embodiment is formed of a transparent material as the first embodiment, or formed of an opaque material with a highly reflected layer formed on the sidewalls thereof as the second embodiment. Also, the mask 200 is the same as those in the first and second embodiments.

In the present embodiment, the plurality of bars 270 is located in the diagonal direction of the mask 200, thus obtaining the same effect as in the above embodiments.

As described above, according to the present invention, a plurality of stripe-shaped bars is arranged to be parallel on one surface of a large-area mask (the surface facing a substrate) such that when the mask is located on the substrate, the bars can support the substrate, thus preventing level shifting of the mask toward the substrate. Accordingly, level shifting of the mask can be prevented without additional tensile springs installed at the edges of the mask, thereby reducing production costs.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A mask comprising:
    a transparent substrate which includes a light transmission region and a light blocking region, and
    a plurality of stripe-shape bars which is arranged on the light transmission region and the light blocking region of the substrate to support the substrate.

2. The mask as claimed in claim 1, wherein the bar is formed of a transparent material.

3. The mask as claimed in claim 2, wherein the bar is formed of one of quartz and glass.

4. The mask as claimed in claim 1, wherein the bar is formed of a material that transmits ultraviolet rays.

5. The mask as claimed in claim 2, wherein an adhesive is intervened between the bar and the light-blocking region.

6. The mask as claimed in claim 4, wherein an adhesive is intervened between the bar and the light-blocking region.

7. The mask as claimed in claim 1, wherein the bar is formed of an opaque material, and a layer having high reflexibility covers both sidewalls of the bar.

8. The mask as claimed in claim 7, wherein the bar is formed of one of aluminum and a stainless material.

9. The mask as claimed in claim 2, wherein when a plane of the transparent substrate is rectangular, the bars are arranged to be parallel in a direction of a minor axis of the transparent substrate.

10. The mask as claimed in claim 4, wherein when a plane of the transparent substrate is rectangular, the bars are arranged to be parallel in a direction of a minor axis of the transparent substrate.

11. The mask as claimed in claim 7, wherein when a plane of the transparent substrate is rectangular, the bars are arranged to be parallel in a direction of a minor axis of the transparent substrate.

12. The mask as claimed in claim 2, wherein when a plane of the transparent substrate is rectangular, the bars are arranged to be parallel in a direction of a major axis of the transparent substrate.

13. The mask as claimed in claim 4, wherein when a plane of the transparent substrate is rectangular, the bars are arranged to be parallel in a direction of a major axis of the transparent substrate.

14. The mask as claimed in claim 7, wherein when a plane of the transparent substrate is rectangular, the bars are arranged to be parallel in a direction of a major axis of the transparent substrate.

15. The mask as claimed in claim 2, wherein the bars are arranged to be parallel in a diagonal direction of the transparent substrate.

16. The mask as claimed in claim 4, wherein the bars are arranged to be parallel in a diagonal direction of the transparent substrate.

17. The mask as claimed in claim 7, wherein the bars are arranged to be parallel in a diagonal direction of the transparent substrate.

18. An exposure system comprising:
    a support which supports a substrate that will undergo a lithographic process or a light curing process;
    a mask which is located over the support and includes a light transmission region and a light blocking pattern region; and
    a light source which is located on the mask,
    wherein a plurality of stripe-shape bars are located on the light transmission region and the light blocking pattern region of the mask surface facing the substrate to support the mask.

19. The exposure system as claimed in claim 18, wherein the bar is formed of a transparent material.

20. The exposure system as claimed in claim 19, wherein the bar is formed of one of quartz and glass.

21. The exposure system as claimed in claim 18, wherein the bar is formed of a material that transmits ultraviolet rays.

22. The exposure system as claimed in claim 19, wherein an adhesive is intervened between the bar and the light-blocking region.

23. The exposure system as claimed in claim 21, wherein an adhesive is intervened between the bar and the light-blocking region.

24. The exposure system as claimed in claim 18, wherein the bar is formed of an opaque material, and a layer having high reflexibility covers both sidewalls of the bar.

25. The exposure system as claimed in claim 24, wherein the bar is formed of one of aluminum and a stainless material.

26. The exposure system as claimed in claim 19, wherein when a plane of the transparent substrate is rectangular, the bars are arranged to be parallel in a direction of a minor axis of the transparent substrate.

27. The exposure system as claimed in claim 21, wherein when a plane of the transparent substrate is rectangular, the bars are arranged to be parallel in a direction of a minor axis of the transparent substrate.

28. The exposure system as claimed in claim 24, wherein when a plane of the transparent substrate is rectangular, the bars are arranged to be parallel in a direction of a minor axis of the transparent substrate.

29. The exposure system as claimed in claim 19, wherein when a plane of the transparent substrate is rectangular, the bars are arranged to be parallel in a direction of a major axis of the transparent substrate.

30. The exposure system as claimed in claim 21, wherein when a plane of the transparent substrate is rectangular, the bars are arranged to be parallel in a direction of a major axis of the transparent substrate.

31. The exposure system as claimed in claim 24, wherein when a plane of the transparent substrate is rectangular, the bars are arranged to be parallel in a direction of a major axis of the transparent substrate.

32. The exposure system as claimed in claim 19, wherein the bars are arranged to be parallel in a diagonal direction of the transparent substrate.

33. The exposure system as claimed in claim 21, wherein the bars are arranged to be parallel in a diagonal direction of the transparent substrate.

34. The exposure system as claimed in claim 24, wherein the bars are arranged to be parallel in a diagonal direction of the transparent substrate.

* * * * *